(12) United States Patent
White et al.

(10) Patent No.: US 11,643,286 B2
(45) Date of Patent: May 9, 2023

(54) AUTOMATED TEACHING OF PICK AND PLACE WORKFLOW LOCATIONS ON AN AUTOMATED PROGRAMMING SYSTEM

(71) Applicant: BPM MICROSYSTEMS, INC., Houston, TX (US)

(72) Inventors: William H. White, Houston, TX (US); Alain A. Mangiat, Houston, TX (US); Josué E. Salazar Vanoye, Pasadena, TX (US); Colin D. Harper, Katy, TX (US)

(73) Assignee: BPM MICROSYSTEMS, Houston, TX (US)

( * ) Notice: Subject to any disclaimer, the term of this patent is extended or adjusted under 35 U.S.C. 154(b) by 567 days.

(21) Appl. No.: 16/681,498

(22) Filed: Nov. 12, 2019

(65) Prior Publication Data
US 2020/0148484 A1 May 14, 2020

Related U.S. Application Data

(60) Provisional application No. 62/759,912, filed on Nov. 12, 2018.

(51) Int. Cl.
*B65G 47/90* (2006.01)
*G05B 19/042* (2006.01)
*B25J 9/16* (2006.01)

(52) U.S. Cl.
CPC .......... *B65G 47/905* (2013.01); *B25J 9/1692* (2013.01); *G05B 19/042* (2013.01); *G05B 2219/25058* (2013.01)

(58) Field of Classification Search
CPC ........ B25J 9/163; B25J 9/1664; B25J 9/0081; B25J 9/1697; B25J 9/1692; G05B 19/423;
(Continued)

(56) References Cited

U.S. PATENT DOCUMENTS 5,939,611 A * 8/1999 Bolotin .................. B25J 9/1692
73/1.79
6,304,051 B1 10/2001 Sagues et al.
(Continued)

OTHER PUBLICATIONS

International Search Report for International Application No. PCT/US19/60967 dated Mar. 4, 2020.
(Continued)

*Primary Examiner* — Timothy R Waggoner
(74) *Attorney, Agent, or Firm* — Carlson, Gaskey & Olds, P.C.

(57) ABSTRACT

The operator may first place a blank device in a first socket in a first site. The APS may self-teach the position and orientation of that first socket by removing and replacing the device in the socket one or more times, and by detecting the position of the device in the socket or by monitoring a change in position of the device as it is placed into the socket. The APS then picks the device from the first socket (or from the input tray) and moves it in succession through the rest of the sockets to establish position and orientation of each socket. After all sockets are taught, the APS loads all sockets with blank devices, and programming begins. Alternatively, the programming job begins as each site is taught and before the remaining sites are taught so that production output can begin "immediately."

19 Claims, 4 Drawing Sheets

(58) Field of Classification Search
CPC .................. G05B 19/425; G05B 19/42; G05B 2219/36433
See application file for complete search history.

(56) References Cited

U.S. PATENT DOCUMENTS

| | | |
|---|---|---|
| 2007/0010969 A1 | 1/2007 | Madsen et al. |
| 2007/0271638 A1* | 11/2007 | Johnson ............. G05B 19/4015 901/3 |
| 2009/0312857 A1 | 12/2009 | Rachkov |
| 2016/0259312 A1 | 9/2016 | Caley et al. |
| 2018/0117767 A1* | 5/2018 | Yokota ................. B25J 15/0616 |
| 2018/0236669 A1* | 8/2018 | Fukuda ................. B25J 13/089 |

OTHER PUBLICATIONS

International Preliminary Report on Patentability for PCT/US2019/060967 dated May 20, 2021.

* cited by examiner

AUTOMATED TEACHING OF PICK AND PLACE WORKFLOW LOCATIONS ON AN AUTOMATED PROGRAMMING SYSTEM

BACKGROUND

The present disclosure relates to teaching the pick and place locations for an automated programming system job on an Automated Programming System, hereafter "APS." Prior to this invention, operators were required to manually assist with teaching each device pick and place location using semi-automated methods. Operators were required to manually load and unload devices for each pick or place point and then assist the APS in determining the X, Y, Z and Theta target location for each workflow pick or place point before the full productivity of the job could begin.

SUMMARY

Disclosed herein are automated methods to setup or teach the pick and place locations for an automated programming system job on an Automated Programming System, hereafter "APS." This reduces the setup time, reduces the level of operator skill required and improves setup accuracy, improves job yield and reduces the frequency of human intervention required. Once the system is configured with the blank devices that will be programmed, input/output peripherals, socket adapters, and the feature is invoked, the system will teach the job and begin processing (programming devices) without operator intervention.

With fully automated self-teaching, operator involvement in the job set-up process is greatly reduced. The initial job set-up of input/out locations and peripherals is familiar Blank devices in media (tape, tray, tube) are loaded and Input/Output peripheral locations are taught. From that point, the process becomes radically different and more productive.

Using multiple pick and place cycles and analyzing results with a mathematical model, the APS will automatically determine, retain and adjust as necessary the target locations for pick and place locations within the programming job workflow. The initial, imprecise locations may be predetermined at the factory before shipment, or subsequently established at the customer location. Alternatively, a camera will assist to identify and establish each target pick or place point using machine vision algorithms.

Each pick and place point has a predetermined location, unique to each APS. The operator may place a blank device in socket A in the master programming site (typically Site 1). The z-height of the first device will be used for all subsequent devices at the respective socket locations. The APS then picks the device from socket A and moves it in succession to sockets B through "n" to establish the X, Y, Z and Theta locations for each socket. After the master site has been taught, the APS subsequently moves the device to all of the other sites and sockets installed on the machine. After all programming sites and sockets are taught, the device is placed in socket A of the master site, the APS loads all sockets with blank devices, and programming begins.

Alternatively, the programming job begins as each site is taught and before the remaining sites are taught so that production output can begin "immediately." Alternatively, all parts are placed into sites automatically using computed locations and/or machine vision or sensors. Alternatively, additional teach locations such as input peripherals, output peripherals and marking peripherals are taught automatically. Alternatively, another method is used to teach the Z height.

The operator can walk away from the APS as soon as the auto-teach process begins. The machine then proceeds to teach and start running the job autonomously. In prior implementations, the operator had to continue to give the machine attention and was unable to walk away from the APS until the job started running.

In one embodiment, the operator only has to manually place at most one device into a socket. In prior implementations, the operator was required to place multiple devices into sockets.

In one embodiment, each blank device that is used for teaching is used to teach at most one socket. In prior implementations, a single device was moved from socket to socket to teach multiple sockets, which could cause some mechanical degradation of the device.

This automated system offers greater accuracy and repeatability than human operators. By automatically identifying, predicting and teaching each pick and place location within the APS workflow, job setup time can be greatly reduced, leading to higher system productivity per job and per year. Further, teaching accuracy and repeatability improves system yield and quality. By automating the teaching process, the requirement for highly skilled operators is reduced, potentially lower the labor burden for the programming process.

DETAILED DESCRIPTION

Figure 1:
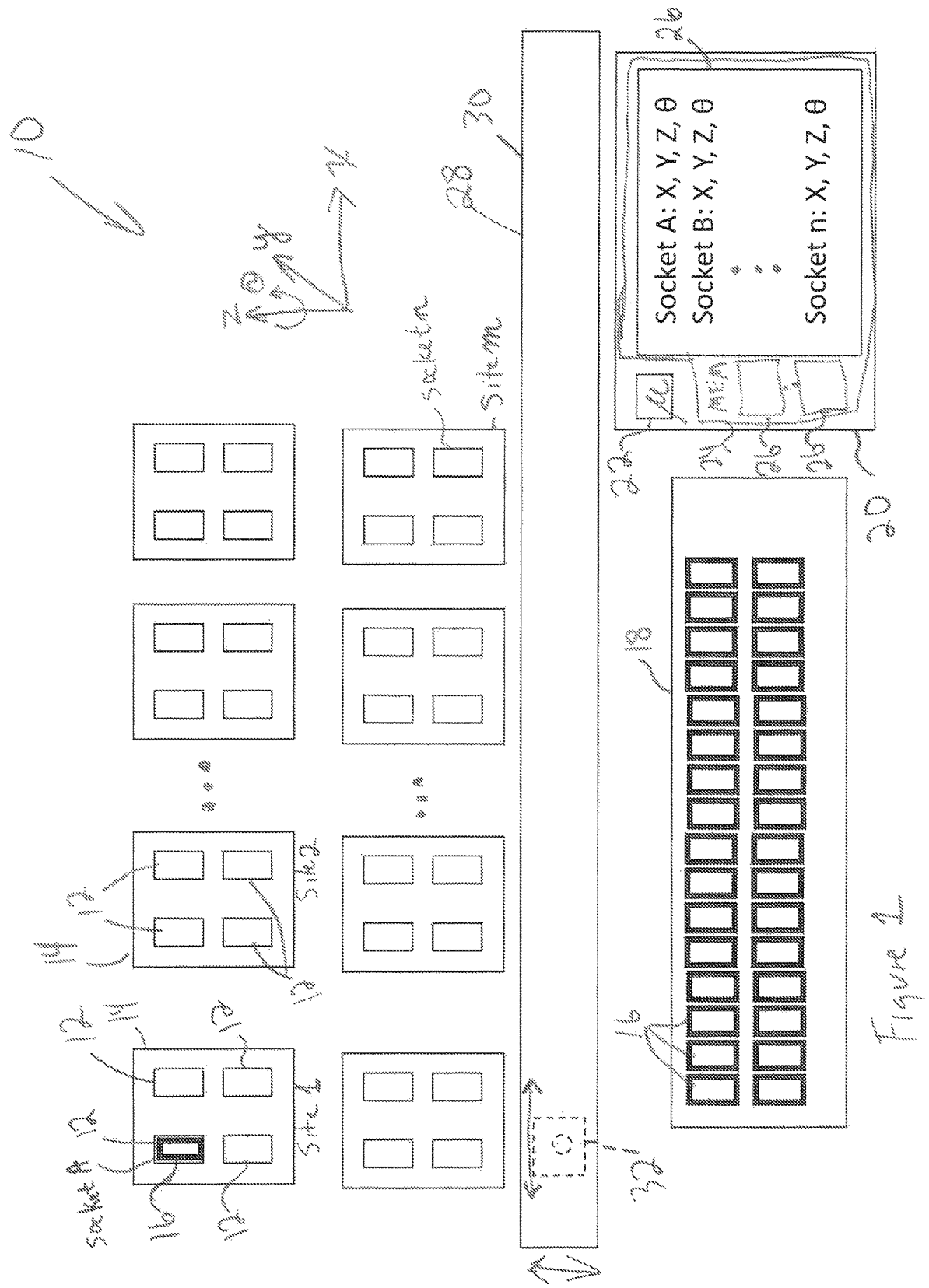
FIG. 1 is a schematic plan view of an automated programming system according to one possible embodiment of the present invention.

An automated programming system 10 is shown in a schematic plan view of FIG. 1. The system 10 includes a plurality of sockets 12 in each of a plurality of sites 14. As is known, the sockets 12 within each site 14 are programmed simultaneously, but programming of the different sites 14 can be initiated independently. In the example shown, the system 10 has m sites and n sockets. In the example shown, there are four sockets 12 per site, but more or fewer are possible.

The sockets 12 are configured to receive programmable devices 16 to be programmed. In FIG. 1, a plurality of blank devices 16 are in an input tray 18 (or other input area) and one device 16 is also shown in socket A in site 1. The programmable devices 16 may be microchips, such as Wafer Level Chip Scale Packaging (WLCSP), small-outline transistors (SOT), dual-flat no-leads (DFN), and the like, which may have an upper surface that is approximately 3 mm by 3 mm or less and a thickness of 0.4 mm or less.

The system 10 further includes a computer 20 having at least one processor 22 executing instructions stored in computer storage 24 (e.g. memory) to perform the algorithms and other steps described herein. The storage 24 also includes location files 26 each storing position (X, Y, Z) and orientation (theta—rotation in the X-Y plane) for a different type of device 16. Initially, during manufacture or initial calibration, a rough initial position and orientation of each socket 12 is stored in the location files 26. This may be set using previous methods.

The computer 20 controls operation of a pick and place system 28, which may include a gantry 30, which is movable along a Y-axis (for example) and a pick head 32 that is movable along the gantry 30 along an X-axis as well as between the gantry 30 and the sockets 12 along a Z-axis. The sockets 12 are generally arranged in a plane parallel to the X and Y-axes.

Figure 2:
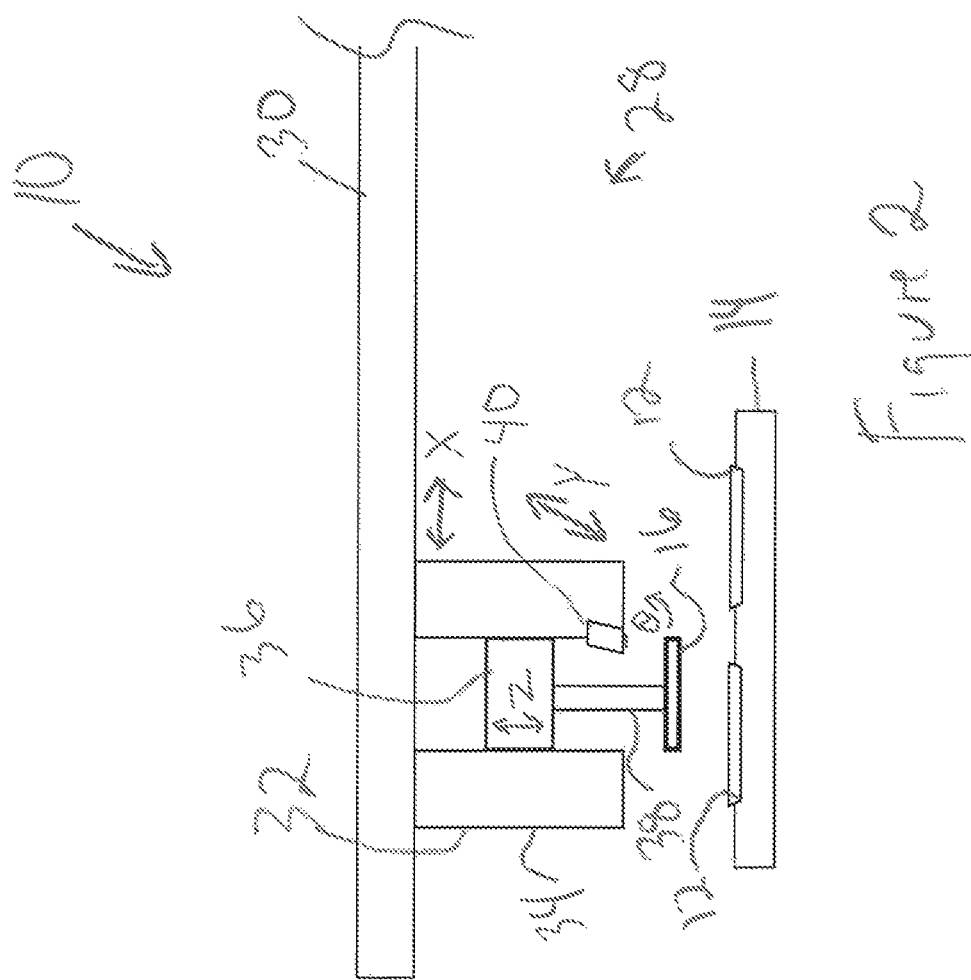
FIG. 2 is a schematic side view of the automated programming system of FIG. 1.

As shown in FIG. 2, the pick head 32 includes a housing 34 and a nozzle 38 movable relative to the housing 34 along a Z-axis, toward and away from the sockets 12. The nozzle 38 can pick a device 16 via negative pressure from the nozzle 38, also controlled by the computer 20. As shown, the sockets 12 are tapered to help precisely properly position the devices 16 relative to the sockets 12 so that proper electrical contacts are made between the device 16 and the socket 12. The electrical contacts are not shown in the figures, but more specifically, the contacts on the sockets may be tapered or concave to more precisely position the device. The contacts on the device 16 locate themselves (with gravity) in the contacts on the sockets 12.

The pick head 32 can place the device 16 in the socket 12, but the device 16 may not be exactly in the correction position or orientation. When the pick head 32 releases the device 16, gravity pulls the device 16 downward against one or more tapered surfaces in the socket 12, which precisely position and orient the device 16 in the socket 12. Thus, there may be some very small movement of the device 16.

One or more sensors, such as a camera 40 may be mounted adjacent the nozzle 38 to take images of the area just in front of the nozzle 38 and send the images to the computer 20. Other sensors, such as one or more lasers, could also be used to detect the position of the device 16.

Figure 3:
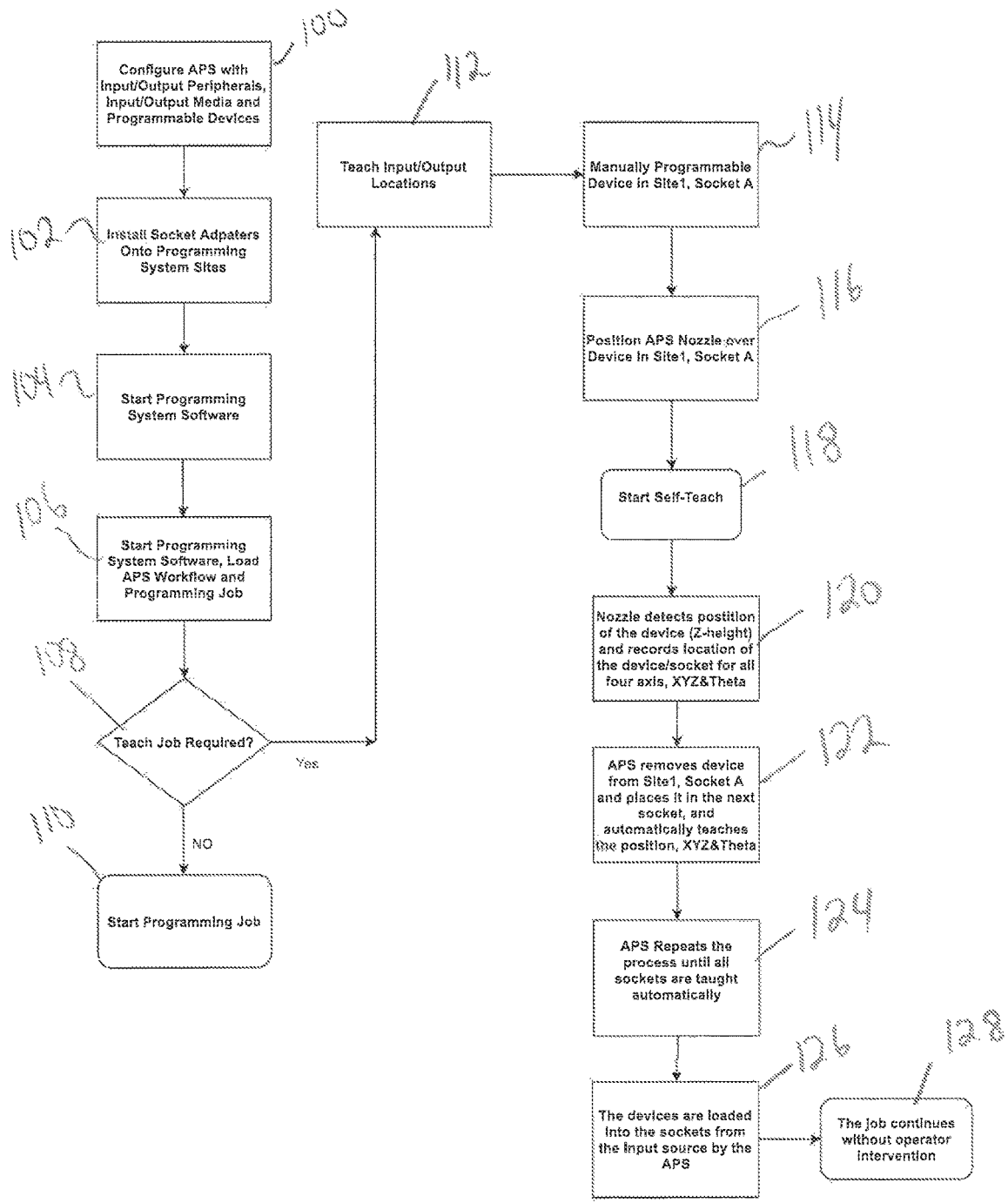
FIG. 3 is a flowchart showing one possible method of the present invention.

A first method for using the system 10 of FIGS. 1 and 2 is shown in the flow chart of FIG. 3. Referring to FIGS. 1-3, in step 100 the system 10 is configured with the input/output peripherals, input/output media, and the devices 16. Socket adapters 12 are installed onto the programming sites 14 in step 102. The programming software in computer 20 is initiated in step 104. In step 106, the APS workflow and programming job is loaded. In step 108, the user is asked whether a teach job is required. If not, the programming job begins in step 110.

If a teach job is required, the input/output locations (such as tray 18) are taught in step 112, such as by operator manually operating controls (keyboard and/or joystick) to move the pick head 32 to the input/output locations. A device 16 may be placed into the first socket 12 (e.g. socket A, site 1) manually by the operator in step 114. The pick head 32 may be moved to the first socket 12 manually by the operator (via user input devices). Alternatively, the computer 20 already has sufficient, although somewhat imprecise, position and orientation information regarding the first socket 12 to move the pick head 32 to the first socket 12.

The self-teach routine then starts in step 118. In step 120, the nozzle 38 detects the position of the device 16 (Z-height) and the computer 20 uses the camera 40 to record the location of the device 16 (the socket 12) for all four axes (X, Y, Z, Theta) into the appropriate location file 26 in computer 20. In step 122, the pick head 32 removes the device 16 from the first socket 12 and places it in the next socket 12 to teach the position and orientation of that socket 12. This teaching process is repeated until all of the sockets 12 (or a subset of sockets 12 that are going to be used) have been taught automatically and the four axes (X, Y, Z, Theta) for the sockets 12 are stored in the appropriate location file 26 in computer 20.

In step 126, devices 16 are then loaded from the tray 18 by the pick head 32. In step 128, the programming job continues in a known manner from that point on without operator intervention.

Figure 4:
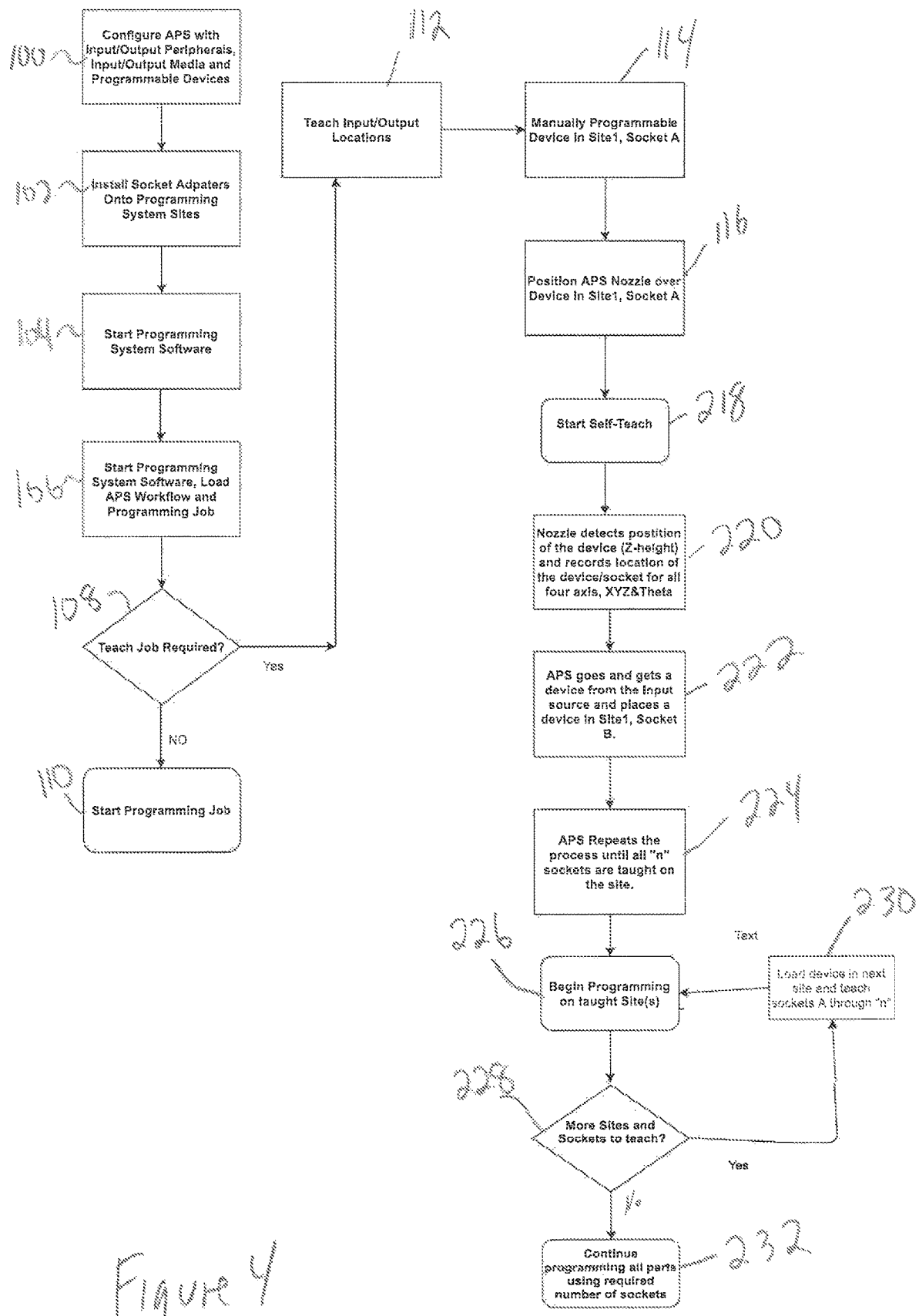
FIG. 4 is a flowchart showing one possible alternate method of the present invention.

A second method for using the system 10 of FIGS. 1-2 is shown in FIG. 4. Referring to FIG. 4, steps 100-116 are the same as in FIG. 3. The self-teach routine 218 is initiated in step 218.

In step 220, the nozzle 38 detects the position of the device 16 (Z-height) and the computer 20 uses the camera 40 to record the location of the device 16 (the socket 12) for all four axes (X, Y, Z, Theta) into the appropriate location file 26 in computer 20. The camera 40 takes an image of the device 16 in the socket 12 after the pick head 32 releases the device 16 in the socket 12 and sends the image to the computer 20. The computer 20 determines the position and orientation of the device 16 in the socket 12 based upon the image. The pick head 32 may remove and replace the device 16 a few (e.g. two) more times, taking images of the device 16 in the socket 12 each time. The computer calculates the position and orientation of the device 16 in the socket 12 based upon the one or more images and updates the stored position (X, Y, Z) and orientation (theta) information for that socket 12 in the appropriate location file 26 for that device 16 type. This information would be used to place and retrieve devices 16 at that socket 12 from that point forward (e.g. until there is a changeover to another device type). This information would also be the initial location information the next time the system 10 is switched back to programming that device type.

Optionally, the camera 40 may take an image of the device 16 just before being released by the pick head 32 and another image just after the device 16 has been received in the socket 12. The computer 20 could compare the two images to determine appropriate corrections to the stored position and orientation information (X, Y, Z, Theta) for that socket 12.

In step 222, the pick head 32 retrieves another device 16 from the input tray 18 and places it in the next socket 12 to teach the position and orientation of that socket 12. This teaching process is repeated until all of the sockets 12 in a site 14 have been taught automatically and the four axes (X, Y, Z, Theta) for the sockets 12 in that site are stored in the appropriate location file 26 in computer 20.

In step 224, since the locations of the devices 16 for the taught site have been calibrated and since devices 16 are in all of the sockets 12 of the taught site 14, programming of the devices 16 at the taught site 14 (and any other previously taught sites) is initiated.

While the devices 16 in the taught sites 14 are being programmed, it is determined if there remain more sites 14 to teach in step 228. If so, then a blank device 16 is loaded into the first socket 12 of the next site 14, and the locations of the sockets 12 in the next site 14 are taught via steps 220-224 while the devices 16 in the taught sites 14 are being programmed.

The programmed devices 16 may be removed and replaced with blank devices 16 for programming, and then the system 10 returns to teaching the locations of the remaining sockets 12, while the blank devices 16 in the taught sites 14 are being programmed.

When all of the sites 14 have been taught, then the system 10 simply loads devices 12 into the sites 14, programs them, and removes them (such as to tray 18 or to a separate output tray), as is known.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope. Alphanumeric identifiers on method steps are for the purpose of ease of reference in dependent claims and do not signify a required order of performance unless otherwise specified.

What is claimed is:

1. An automated pick and place system for devices comprising:
   a plurality of sockets for receiving devices;
   a movable pick head configured to pick devices from a supply and place the devices into the plurality of sockets based upon a stored location of each of the plurality of sockets; and
   a camera configured to detect a change in position or orientation of a device placed into one of the plurality of sockets, the movable pick head configured to calibrate the stored location of the one of the plurality of sockets based upon the detected change in position or orientation.

2. The system of claim 1 wherein the plurality of sockets are arranged in a plurality of sites, wherein each of the plurality of sites include a subset of the plurality of sockets, and wherein each of the sites is configured to simultaneously program devices received in the associated subset of the plurality of sockets independently of the others of the plurality of sites.

3. The system of claim 2 further including a computer programmed to control movement of the pick head to each of the stored locations of the plurality of sockets.

4. The system of claim 3 wherein the computer is programmed to initiate programming of a first site of the plurality of sites upon calibration of the stored locations of a first subset of the plurality of sockets associated with the first site prior to calibration of the stored locations of a second subset of the plurality of sockets associated with a second site of the plurality of sites.

5. The system of claim 4 wherein the camera takes a first image of the device prior to release by the pick head to the one of the plurality of sockets and wherein the camera takes a second image of the device after the device is received in the one of the plurality of sockets.

6. The system of claim 5 wherein the computer is programmed to compare the first image to the second image to detect the change in position or orientation.

7. The system of claim 6 wherein the second image of the device is while the device is in the one of the plurality of sockets.

8. The system of claim 6 wherein the first image of the device is while the device is being held by the movable pick head.

9. The system of claim 8 wherein the second image of the device is while the device is in the one of the plurality of sockets.

10. The system of claim 9 wherein the camera is mounted to the movable pick head.

11. The system of claim 1 wherein the camera is mounted to the movable pick head.

12. A method for self-teaching socket location by an automated pick and place system, the method including the steps of:
    a) picking a device;
    b) moving the device to a stored location of a first socket of a plurality of sockets, wherein each of the plurality of sockets are at a first site, wherein the plurality of sockets at the first site are configured to program simultaneously;
    c) placing the device in the first socket;
    d) determining a placed location of the device in the first socket, while the device is in the first socket; and
    e) modifying the stored location of the first socket based upon said step d);
    wherein said steps a)-e) are performed automatically by or at the direction of a computer and wherein said steps a)-e) are performed for each of the plurality of sockets.

13. The method of claim 12 wherein the device is one of a plurality of first devices each placed into one of the plurality of sockets at the first site.

14. The method of claim 13 wherein said steps a)-e) are repeated for each of a plurality of sites including the first site.

15. The method of claim 14 further including the step of initiating programming of the devices at the first site before initiating steps a)-e) for a second site of the plurality of sites.

16. The method of claim 15 wherein said step d) is performed based upon an image of the device.

17. The method of claim 16 wherein said step a) is performed by a pick head and the image is captured by a camera secured to the pick head.

18. The method of claim 12 wherein said step d) is performed based upon an image of the device, and wherein said step a) is performed by a pick head and the image is captured by a camera secured to the pick head.

19. A method of programming a plurality of devices including the steps of:
    a) calibrating locations of a plurality of first sockets at a first site;
    b) placing a first plurality of devices in the plurality of first sockets at the first site;
    c) initiating programming of the first plurality of devices in the plurality of first sockets;
    d) calibrating locations of a plurality of second sockets at a second site;
    e) after said step c), placing a second plurality of devices in the plurality of second sockets at the second site; and
    f) initiating programming of the second plurality of devices in the plurality of second sockets independently of said step c);
    wherein the locations of each of the plurality of first sockets at the first site is calibrated in said step a) after each of the first plurality of devices is placed into associated ones of the plurality of first sockets at the first site in said step b).

* * * * *